United States Patent [19]

Cricchi et al.

[11] Patent Number: 4,685,194

[45] Date of Patent: Aug. 11, 1987

[54] DIRECT MOAT SELF-ALIGNED FIELD OXIDE TECHNIQUE

[75] Inventors: James R. Cricchi, Catonsville; Franklin C. Blaha, Arnold, both of Md.

[73] Assignee: The United States of America as represented by the Secretary of the Air Force, Washington, D.C.

[21] Appl. No.: 789,863

[22] Filed: Oct. 21, 1985

[51] Int. Cl.$^4$ ............................................. H01L 21/465
[52] U.S. Cl. ........................................... 437/41; 437/61
[58] Field of Search ................ 29/571, 576 B, 576 W, 29/578, 580; 148/1.5; 357/23.1, 41, 55; 156/653

[56] References Cited

U.S. PATENT DOCUMENTS

| | | | |
|---|---|---|---|
| 3,961,999 | 6/1976 | Antipov | 148/175 |
| 3,999,209 | 12/1976 | Wrigley et al. | 357/23 |
| 4,110,899 | 9/1978 | Nagasawa et al. | 29/571 |
| 4,313,768 | 2/1982 | Sanders et al. | 148/1.5 |
| 4,455,737 | 6/1984 | Godejahn, Jr. | 29/571 |
| 4,464,825 | 8/1984 | Ports | 29/577 C |
| 4,470,852 | 9/1984 | Ellsworth | 148/1.5 |
| 4,471,523 | 9/1984 | Hu | 29/571 |
| 4,577,392 | 3/1986 | Peterson | 29/571 |

OTHER PUBLICATIONS

S. M. Sze, *VLSI Technology*, McGraw-Hill, pp. 465–468, 500–503.

T. Shibata, "New Device Isolation Technology for the VLSI Era", Trends in Submicron MOS Process Technology, pp. 23–30.

S. Weber, *Large and Micron Scale Integration*, McGraw Hill, 1974, pp. 48–52.

B. Streetman, *Solid State Electronic Devices*, Prentice Hall, 1980, 2nd edition, pp. 314–322 and 337.

Primary Examiner—Brian E. Hearn
Assistant Examiner—T. N. Quach
Attorney, Agent, or Firm—Stanton E. Collier; Donald J. Singer

[57] ABSTRACT

The process of the present invention produces CMOS bulk circuits allowing any treatment of the field oxide up to and including the channel edge; allows p-field boron implant to increase parasitic threshold eliminates the bird's beak oxide encroachment which reduces channel width and recessed oxide along the channel edge; provides for a self-aligned p-field implant; and provides for a spacer use on a self-aligned p-field implant to offset effects of side diffusion and oxide undercut. (1) Growing a field oxide layer including any specialized hardening techniques thereto on a silicon wafer; (2) Depositing a material which will serve as an implant mask such as aluminum; (3) Etching this layer to leave shapes where the thin oxide gate regions are to be; (4) Depositing a spacer material such as sputtered nitride onto the shapes; (5) Etching the spacer material; (6) Depositing a field implant mask; (7) Etching the implant mask; (8) Implanting the field regions; (9) Stripping the implant mask; (10) Stripping the spacer material if used; (11) Depositing a secondary masking layer such as Ti-W or W; (12) Bias sputtering away secondary masking material at edges of aluminum shapes; (13) Removing aluminum shapes using secondary material as a mask; (14) Etching oxide under aluminum shapes to reach the silicon wafer; (15) Stripping secondary masking layer; (16) Growing gate oxide; (17) Removing field oxide layer to expose source and drain regions in the wafer; and (18) Placing electrodes onto the drain, source, and gate regions.

5 Claims, 8 Drawing Figures

DIRECT MOAT SELF-ALIGNED FIELD OXIDE TECHNIQUE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to the process of fabricating semiconductor devices, and, more particularly, relates to the process of fabricating CMOS devices.

One prior technique of fabricating MOS devices, for example, used the Planox process. In this process a layer of silicon nitride is deposited on the wafer. The silicon nitride layer is then etched in a desired manner. Next a layer of silicon dioxide (a thick field oxide) is grown in those areas where there is no silicon nitride. As normally occurs during this process, the oxide spreads under the silicon nitride layers and produces what is called a "bird's beak." This bird's beak reduces the effective channel width and further increases parasitic inversion regions. After the field oxide is grown, the silicon nitride mask is removed and a second mask is placed upon the exposed wafer and is used to establish drain and source areas. The doping of these areas can be carried out by ion implantation. After the doping, additional silicon dioxide is grown over the source and drain areas as appropriate. The second mask is removed which was protecting the gate areas and these areas then have a thin layer of oxide grown thereon for a gate. Selective areas of the oxide on the source and drain are removed so that contacts such as aluminum can be placed on these areas and on the gate oxide also.

As noted above one disadvantage is the formation of the bird's beak. As the oxide grows below the silicon surface, it forms along the edges of the source or drain junctions therewith. With positive charge build up in the oxide or near the oxide-silicon interface from either processing parameters or total dose irradiation, a parasitic inversion region forms resulting in drain to source leakage. The amount of leakage and circumstances under which it results can be minimized by either hardening of the field oxide itself to reduce charge build-up or increasing the surface concentration to raise the parasitic threshold. The difficulty with the local oxidation (LOCOS) process is that both oxide hardening techniques and implants require controlling the oxide and silicon surface concentration under and adjacent to the bird's beak encroachment. None of the known oxide hardening techniques can be applied selectively to the oxide which encroaches under the silicon nitride mask. A separate masking operation to define an implant to protect this region has severe layout density impact for small geometries because of the alignment tolerance requirements to allow re-alignment to the oxide edge.

SUMMARY OF THE INVENTION

The present invention is directed toward providing a technique in which the bird's beak problem and the oxide charge build-up problem are reduced substantially and providing self-alignment of the field implant.

The process of the present invention produces CMOS bulk circuits allowing any treatment of the field oxide up to and including the channel edge; allows p-field boron implant to increase parasitic threshold, eliminates the bird's beak oxide encroachment which reduces channel width and recessed oxide along the channel edge; provides for a self-aligned p-field implant; and provides for a spacer use on a self-aligned p-field implant to offset effects of side diffusion and oxide undercut.

The process of the present invention involves the following steps: (1) Growing a field oxide layer including any specialized hardening techniques thereto on a silicon wafer; (2) Depositing a material which will serve as an implant mask such as aluminum; (3) Etching this layer to leave shapes where the thin oxide gate regions are to be; (4) Depositing a spacer material such as sputered nitride onto the shapes; (5) Etching the spacer material; (6) Depositing a field implant mask; (7) Etching the implant mask; (8) Implanting the field regions; (9) Stripping the implant mask; (10) Stripping the spacer material if used; (11) Depositing a secondary masking layer such as Ti-W or W; (12) Bias sputtering away secondary masking material at edges of aluminum shapes; (13) Removing aluminum shapes using secondary material as a mask; (14) Etching oxide under aluminum shapes to reach the silicon wafer; (15) Stripping secondary masking layer; (16) Growing gate oxide; (17) Removing field oxide layer to expose source and drain regions in the wafer; and (18) Placing electrodes onto the drain, source, and gate areas.

It is therefore one object of the present invention to provide a process that allows any hardening treatment of a field oxide layer up to and including the channel edge.

It is another object of the present invention to provide a process that eliminates the bird's beak oxide encroachment and recessed oxide along the channel edge.

It is another object of the present invention to provide a process for self-aligning p-field implant in CMOS.

It is yet another object of the present invention to provide a spacer for use as a self-aligned p-field implant to offset effects of side diffusion and oxide undercut.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1A:
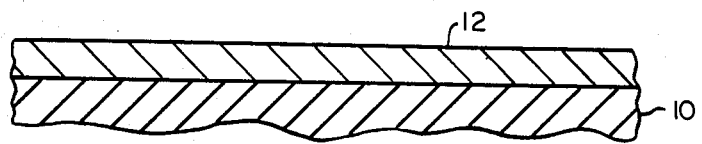
FIGS. 1A–1H are partial cross sections of a semiconductor device using the process of the present invention. de

Referring to FIG. 1A a wafer 10, preferably made of silicon, has grown thereon by conventional techniques a field oxide layer 12 of silicon dioxide which can be on the order of one micrometer thick. Wafer 10 is a conventional slice of silicon used and prepared for the fabrication of integrated circuits thereon. Field oxide layer 12 may be hardened against radiation and the effects thereof to protect the electronic devices, not shown, formed on wafer 10.

Figure 1B:
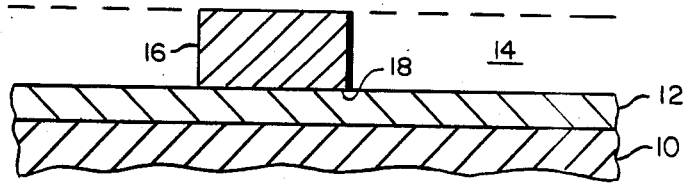

On top of field oxide layer 12, a gate masking layer 14, shown in outline in FIG. 1B, of material which will serve as an implant mask is deposited thereon. Layer 14 may be aluminum deposited by vapor deposition, for example, or by molecular beam epitaxy. A photoresist layer, not shown, is applied over layer 14, patterned by a mask, not shown, and anisotropically etched to leave shapes such as shape 16 over a gate region 18 where a thin oxide layer 20, FIG. 1H, is to be grown. The remaining photoresist on top of shapes 16 is removed.

Figure 1C:
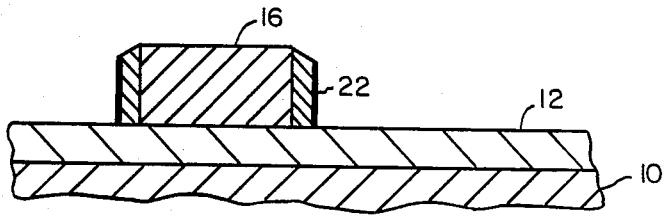

In FIG. 1C, a spacer 22 may be placed about shape 16. The width of spacer 22 can be adjusted to take into account subsequent etching of the oxide and side scatter of the implant. Spacer 22 is deposited, patterned, and anisotropically etched in a conventional manner.

Figure 1D:
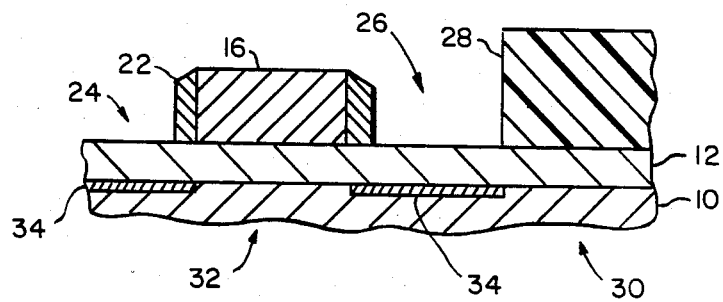
Figure 1E:
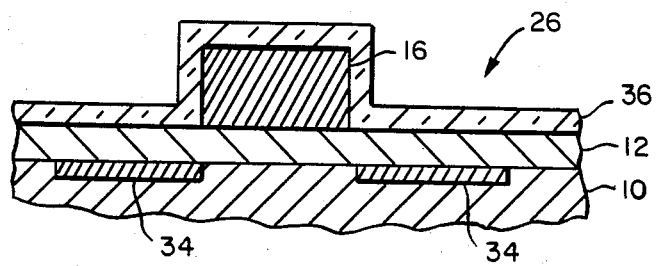

To establish the drain region 24 and source region 26, for example, FIG. 1D, a p-field implant photoresist 28 is formed by conventional photolithographic techniques. Resist 28 protects n-well regions 30 and the shape 16 protects n-channel region 32 from ions implanted in drain region 24 and source region 26. Spacer 22 prevents side scatter into n-channel region 32. Boron ions are then implanted into drain region 24 and source region 26 to form implanted p-field regions 34. The concentration, depth, and width of p-field regions 34 are controlled during implantation.

After this, photoresist 28 and spacer 22 are removed. Spacer 22 may remain on shape 16 to prevent side undercut of oxide layer 12. A secondary masking layer 36 is then deposited on layer 12 and shape 16. The material of layer 36 must not be soluble in the chemical etch used for removing shapes 16. Layer 36 may be platinum, titanium-tungsten, or tungsten.

Figure 1F:
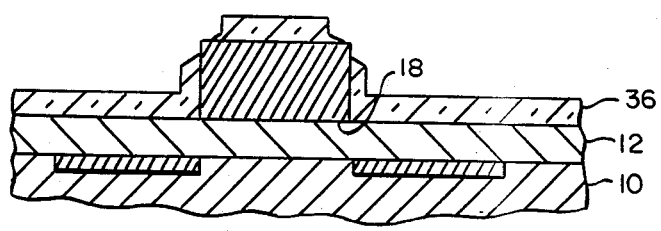
Figure 1G:
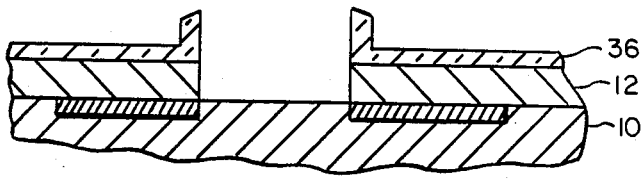
Figure 1H:
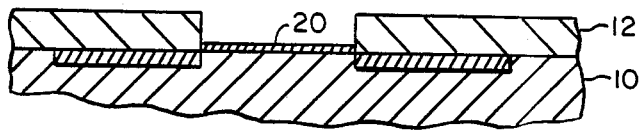

To obtain access to shape 16 the edges of secondary masking layer 36 are bias sputtered away. It has been found that differential sputter rates in excess of 4:1, material removed on edges versus flat areas, have been obtained. FIG. 1F. Shape 16 is then washed out leaving exposed field oxide layer 12 under shape 16. Conventional photoresist stripping chemical can be used to remove shape 16 from layer 36. This region 18 is then anisotropically etched to expose wafer 10 in n-channel region 32 where a gate may be established for a FET, for example. Masking layer 36 is then removed and thin oxide layer 20 is grown, FIG. 2O. As seen therein, contact openings, not shown, must be made in field oxide layer 12 to establish electrical contact areas with p-field regions 34 of drain region 24 and source region 26. Electrodes, not shown, are then placed on p-field regions 34 and thin oxide layer 20. The electrodes may be a metal such as aluminum or doped polycrystalline silicon.

Hardening is provided by a process which allows any treatment of field oxide layer 12 up to and including the channel edge; a p-field boron implant increases parasitic threshold; the bird's beak oxide encroachment and recessed oxide along the channel edge are eliminated; high density is maintained by eliminating the oxide encroachment which reduces channel width; a self-aligned p-field implant is provided; and a spacer 22 is used on a self-aligned p-field implant to offset effects of side diffusion and oxide undercut.

Clearly, many modifications and variations of the present invention are possible in light of the above teachings and it is therefore understood, that within the inventive scope of the inventive concept, the invention may be practiced otherwise than specifically claimed.

What is claimed is:

1. A process for fabricating a MOS semiconductor device on a silicon wafer, said process comprising the steps of:

forming a field oxide layer on said wafer;

depositing a gate masking layer on said field oxide layer, said gate masking layer preventing the ion implantation of doping ions therethrough;

removing selectively portions of said gate masking layer, remaining portions of said gate masking layer vertically conforming to gate regions of said semiconductor device;

depositing a photoresist on said field oxide layer and on said remaining portions of said gate masking layer;

removing selectively portions of said photoresist, remaining portions of said photoresist forming an implant mask in cooperation with said remaining portion of said gate masking layer;

implanting dopants into said wafer, said implanting occuring in regions having no gate masking and no implant mask thereon;

removing said remaining portions of said photoresist;

depositing a secondary masking layer upon said field oxide layer and said gate masking layer, said second masking layer being of a matter not dissolvable in a chemical solution for dissolving said gate masking layer;

removing selectively portions of said secondary masking layer upon said gate masking layer by bias sputtering;

removing said remaining portion of said gate masking layer leaving said secondary masking layer that remains;

removing said field oxide layer exposed by removing said remaining portion of said gate masking layer to expose said gate regions;

removing said secondary masking layer;

forming a gate oxide layer in said gate regions;

depositing a drain/source photoresist layer on said field oxide layer and said gate oxide layer;

removing selectively portions of said drain/source photoresist;

removing said field oxide layer under said portions of said drain/source photoresist selectively removed whereby said regions of said wafer having implant are exposed;

removing said drain/source photoresist;

depositing on said field oxide layer, on said oxide gate layer and on said wafer an electrode layer;

depositing on said electrode layer a photoresist layer;

removing selectively said photoresist and said electrode layer, remaining portions of said electrode layer, forming electrical contacts on gate, drain and source regions; said contact on said gate region being said gate electrode;

removing said photoresist; and electrically connecting said contacts to form said semiconductor device.

2. A process as defined in claim 1 wherein said field oxide layer is about one mirometer thick and said gate oxide layer is about 0.1 micrometers thick.

3. A process as defined in claim 1 wherein one of said dopant are selected from the group consisting of boron.

4. A process as defined in claim 1 including the additional steps of depositing a spacer material on said gate masking layer and on said field oxide layer; removing selectively said spacer material by photolithography to leave spacers attached to the sides of the remaining portions of said gate masking layer, and removing selectively said spacers.

5. A process as defined in claim 1 wherein said secondary masking layer is removed selectively by bias sputtering whereby top portions of said remaining portions of said gate masking layer are exposed.

* * * * *